(12) United States Patent
Lam et al.

(10) Patent No.: US 7,473,921 B2
(45) Date of Patent: Jan. 6, 2009

(54) NONVOLATILE MEMORY CELL WITH CONCENTRIC PHASE CHANGE MATERIAL FORMED AROUND A PILLAR ARRANGEMENT

(75) Inventors: Chung Hon Lam, Peekskill, NY (US); Alejandro Gabriel Schrott, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 205 days.

(21) Appl. No.: 11/448,549

(22) Filed: Jun. 7, 2006

(65) Prior Publication Data

US 2007/0295948 A1 Dec. 27, 2007

(51) Int. Cl.
*H01L 47/00* (2006.01)

(52) U.S. Cl. .................. 257/4; 257/2; 257/E45.002; 257/E45.003

(58) Field of Classification Search ............ 257/2, 257/4
See application file for complete search history.

(56) References Cited

U.S. PATENT DOCUMENTS

| | | | | |
|---|---|---|---|---|
| 6,507,061 | B1 * | 1/2003 | Hudgens et al. | 257/295 |
| 7,005,665 | B2 * | 2/2006 | Furkay et al. | 257/2 |
| 2006/0006374 | A1 * | 1/2006 | Chang | 257/2 |
| 2006/0226409 | A1 * | 10/2006 | Burr et al. | 257/2 |
| 2006/0261321 | A1 * | 11/2006 | Happ et al. | 257/1 |
| 2007/0109836 | A1 * | 5/2007 | Lung | 365/148 |
| 2007/0246748 | A1 * | 10/2007 | Breitwisch et al. | 257/246 |
| 2008/0023685 | A1 * | 1/2008 | Czubatyj et al. | 257/2 |
| 2008/0043520 | A1 * | 2/2008 | Chen | 365/163 |
| 2008/0054245 | A1 * | 3/2008 | Ahn | 257/3 |
| 2008/0142777 | A1 * | 6/2008 | Park et al. | 257/4 |

OTHER PUBLICATIONS

U.S. Appl. No. 11/100,312, filed Apr. 6, 2005 and entitled "Structure for Confining the Switching Current in Phase Memory (PCM) Cells."
A. Pirovano et al., "Electronic Switching in Phase-Change Memories," IEEE Transactions on Electron Devices, vol. 51, No. 3, pp. 452-459, Mar. 2004.
A.L. Lacaita et al., "Electrothermal and Phase-Change Dynamics in Chalcogenide-Based Memories," Electron Devices Meeting, IEDM Technical Digest, IEEE International, 4 pages, 2004.

* cited by examiner

*Primary Examiner*—Bradley W Baumeister
*Assistant Examiner*—Eric Ward
(74) *Attorney, Agent, or Firm*—Ido Tuchman; Ryan, Mason & Lewis, LLP

(57) ABSTRACT

A memory cell comprises a first feature and a second feature. The second feature comprises a dielectric material and defines an opening at least partially overlying the first feature. A third feature is formed on the first feature and partially fills the opening in the second feature. What is more, a phase change material at least fills a volume between the second feature and the third feature. At least a portion of the phase change material is operative to switch between lower and higher electrical resistance states in response to an application of a switching signal to the memory cell.

1 Claim, 8 Drawing Sheets

NONVOLATILE MEMORY CELL WITH CONCENTRIC PHASE CHANGE MATERIAL FORMED AROUND A PILLAR ARRANGEMENT

FIELD OF THE INVENTION

This invention relates to memory cells in integrated circuits, and, more particularly, to memory cells comprising phase-change materials.

BACKGROUND OF THE INVENTION

The possibility of using phase change materials (PCMs) in nonvolatile memory cells has recently gained momentum as more is learned about these materials and their integration into integrated circuits. When incorporated in a memory cell, these materials can be toggled between higher and lower electrical resistance states by applying a pulse of electrical current ("switching current pulse") to the memory cell. Subsequently, after writing to a memory cell in this way, the electrical resistance state of the given memory cell can be determined (i.e., read) by applying a low magnitude sensing voltage to the material in order to determine its electrical resistance state.

Currently, binary and ternary chalcogenide alloys such as doped SbTe and $Ge_2Sb_2Te_5$ (GST) are showing the greatest promise for use in practical PCM-based memory cells. A. Pirovano et al., "Electronic Switching in Phase-Change Memories," IEEE Transactions on Electron Devices, Vol. 51, No. 3, March 2004, for example, describes such a use of chalcogenides and is incorporated herein by reference. However, the switching of a PCM-based memory cell requires that the switching current pulse produce enough heat in the PCM to cause at least some portion of the PCM to reproducibly change electrical resistance state. The required temperature, for example, may be as high 650 degrees Celsius. If the memory cell is not properly designed, the magnitude of the switching current pulse necessary to create these required temperatures can easily exceed that which can be tolerated by modern integrated circuits.

Fortunately, advances in PCM-based memory cells can be made by recognizing that the heat generated by the switching current pulse in the PCM is largely a function of two factors: 1) the localized switching current density; and 2) the rate of heat dissipation from the volume being heated. U.S. patent application Ser. No. 11/100,312, entitled "Structure for Confining the Switching Current in Phase Memory (PCM) Cells" (filed Apr. 6, 2005), for example, uses sidewall spacers and gas-filled cavities to reduce the required magnitude of the switching current pulse in a PCM-based memory cell. Nevertheless, there remains a need for additional PCM-based memory cell designs that allow the magnitude of the associated switching current pulses to be reduced to a value that is compatible with modern integrated circuits.

SUMMARY OF THE INVENTION

Embodiments of the present invention address the above-identified need by providing PCM-based memory cell designs that both force the switching current to pass through a confined volume in the PCM and thermally isolate the switching volume. Advantageously, these designs provide high localized switching current density and heating efficiency so that the magnitude of the switching current pulse can be reduced to a value that is compatible with modern integrated circuits.

In accordance with an aspect of the invention, a memory cell comprises a first feature and a second feature. The second feature comprises a dielectric material and defines an opening at least partially overlying the first feature. A third feature is formed on the first feature and partially fills the opening in the second feature. What is more, a phase change material at least fills a volume between the second feature and the third feature. At least a portion of the phase change material is operative to switch between lower and higher electrical resistance states in response to an application of a switching signal to the memory cell.

In an illustrative embodiment, a memory cell comprises a dielectric layer patterned to define a round opening. A dielectric pillar fills a portion of this opening. Moreover, GST fills the narrow, ring-like volume between the dielectric pillar and the sidewalls of the opening in the dielectric layer. When a switching current pulse is applied to the memory cell, the switching current must pass through this narrow, ring-like volume of PCM in this portion of the memory cell. This volume of PCM thereby becomes the switchable volume of the PCM.

Advantageously, the magnitude of the switching current pulse required to cause the PCM in this limited switchable volume is substantially less than that which would be required to cause an electrical resistance state transition in the remainder of the PCM volume. This memory cell design, therefore, utilizes high localized switching current density and heating efficiency to reduce the required magnitude of the switching current pulse.

These and other features and advantages of the present invention will become apparent from the following detailed description which is to be read in conjunction with the accompanying figures.

DETAILED DESCRIPTION OF THE INVENTION

Figure 1A:
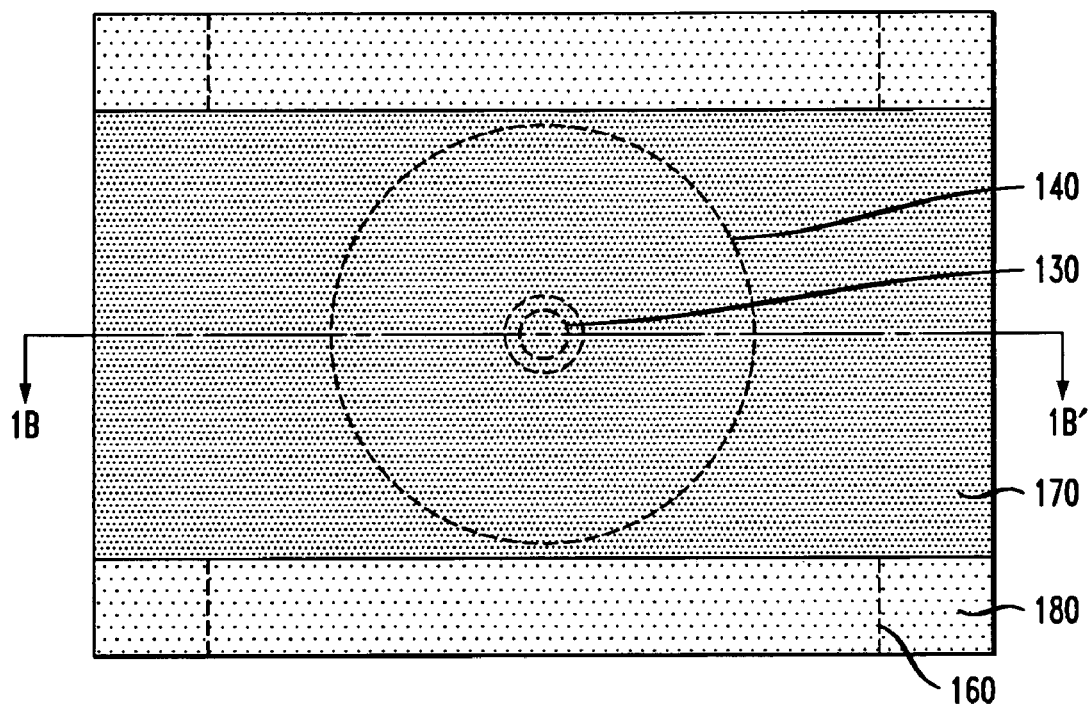
FIG. 1A shows a plan view of a PCM-based memory cell in accordance with a first illustrative embodiment of the invention.

This invention will be illustrated herein in conjunction with exemplary memory cells for use in integrated circuits and methods for forming such memory cells. It should be understood, however, that the invention is not limited to the particular materials, features and processing steps shown and described herein. Modifications to the illustrative embodiments will become apparent to those skilled in the art.

Particularly with respect to processing steps, it is emphasized that the descriptions provided herein are not intended to encompass all of the processing steps which may be required to successfully form a functional integrated circuit device. Rather, certain processing steps which are conventionally used in forming integrated circuit devices, such as, for example, wet cleaning and annealing steps, are purposefully not described herein for economy of description. However one skilled in the art will readily recognize those processing steps omitted from these generalized descriptions. Moreover, details of the processing steps used to fabricate such integrated circuit devices may be found in a number of publications, for example, S. Wolf and R. N. Tauber, *Silicon Processing for the VLSI Era, Volume* 1, Lattice Press, 1986 and S. M. Sze, *VLSI Technology, Second Edition*, McGraw-Hill, 1988, both of which are incorporated herein by reference.

One skilled in the art will also recognize that integrated circuits are typically formed in semiconductor wafers (i.e., substrates) that have two substantially flat surfaces before processing is initiated. The vertical direction is defined herein to be a direction perpendicular to these flat surfaces. In contrast, the horizontal or lateral direction is defined to be a direction parallel to these flat surfaces.

What is more, the term "phase-change material" (PCM) as used herein is intended to encompass any material displaying more than one programmable electrical resistance state for use in integrated circuits. It is recognized that this definition may encompass more materials than are customarily included within this term. PCMs as used herein comprise, for example, various chalcogenides and transition metal oxides and include, but are not limited to, doped or undoped GeSb, SbTe, $Ge_2Sb_2Te_5$ (GST), $SrTiO_3$, $BaTiO_3$, $(Sr,Ba)TiO_3$, $SrZrO_3$, $Ca_2Nb_2O_7$, $(Pr,Ca)MnO_3$, $Ta_2O_5$, $NiO_x$ and $TiO_x$, as well as other suitable materials.

It should also be understood that the various layers and/or regions shown in the accompanying figures are not drawn to scale, and that one or more layers and/or regions of a type commonly used in integrated circuits may not be explicitly shown in a given figure for economy of description. For example, those integrated circuit features associated with what is commonly referred to as the front-end-of-line and middle-of-line are not described herein. This does not imply that the layers and/or regions not explicitly shown are omitted from the actual integrated circuit.

Two illustrative memory cell embodiments will be described herein. For ease of understanding, the design and operating characteristics of the first memory cell embodiment will be described and then illustrative methods for forming that memory cell in an integrated circuit will be addressed. Subsequently, aspects of the second memory cell embodiment will be described in the same order.

Figure 1B:
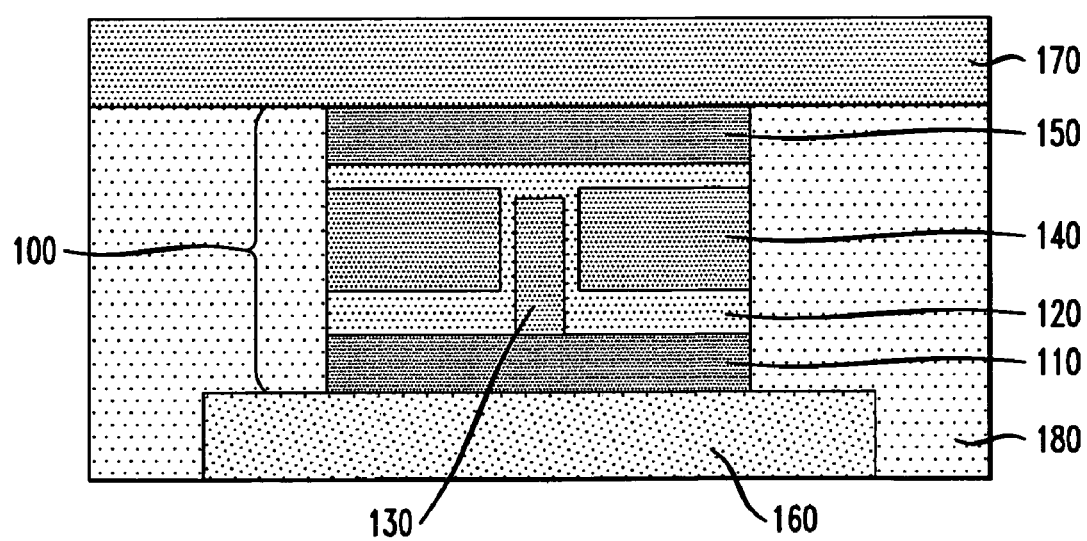
FIG. 1B shows a sectional view of the FIG. 1A memory cell cut in the plane indicated on FIG. 1A.

FIGS. 1A and 1B show a memory cell 100 in accordance with a first illustrative embodiment of the invention. FIG. 1A shows a plan view while FIG. 1B shows a sectional view cut in the plane along line 1B-1B' indicated on FIG. 1A. The memory cell comprises lower electrode 110, PCM 120, dielectric pillar 130, cell dielectric 140, and upper electrode 150. These elements, in turn, are formed between a bottom metal feature 160 and a top metal feature 170. Interlevel dielectric 180 surrounds the memory cell and provides isolation between discrete memory cells and metal features.

The metal features 160, 170 form part of the metallization of the integrated circuit in which the memory cell 100 is encompassed. In this particular embodiment, the bottom and top metal features are two intersecting metallic lines that run perpendicular to one another. The memory cell, in turn, is disposed where the two metallic lines intersect. Nevertheless, this particular arrangement is merely illustrative and a number of other arrangements would still come within the scope of the invention. For example, rather than being a metallic line, the lower metal feature could be a metal contact (i.e., stud) on which the memory cell is formed. This metal contact could, for example, be operative to electrically connect the memory cell to a field effect transistor that resides at a different level in the integrated circuit. These and other variations on the placement of the memory cell within the metallization of an integrated circuit will be familiar to one skilled in the art.

The lower metal feature 160 preferably comprises tungsten or copper while the top metal feature 170 preferably comprises copper. In the memory cell 100, the PCM 120 preferably comprises GST, and the dielectric pillar 130 and cell dielectric 140 preferably comprise silicon dioxide or silicon nitride. The lower and upper electrodes 110, 150 preferably comprise titanium nitride or tantalum nitride. Both titanium nitride and tantalum nitride display a low diffusion rate for metallic elements. As a result, forming the lower and upper electrodes out of these materials keeps metallic elements contained in the bottom and top metal features 160, 170 from diffusing into the PCM.

Storing data in the memory cell 100 comprises placing some portion of the total volume of the PCM 120 (the "switchable volume") into either a lower electrical resistance polycrystalline state or a higher electrical resistance amorphous state. Transitions between these states are accomplished by heating the switchable volume of the PCM by applying a pulse of switching current to the memory cell through the bottom and top metal features 160, 170. The duration of the switching current pulse is preferably between about one and about 500 nanoseconds and has a fast falling edge (i.e., less than about ten nanoseconds), although the invention is not limited to any particular duration and/or rise or fall time of the switching current pulse. The fast falling edge acts to freeze the switchable volume of the PCM in its current electrical resistance state without allowing additional time for the bonds within the material to continue to rearrange.

Subsequently, reading the state of the memory cell 100 can be accomplished by applying a sensing voltage to the memory cell, again via the bottom and top metal features 160, 170. The ratio of the electrical resistances between the higher and lower electrical resistance states in a typical PCM is between about 100:1 and 1,000:1. The sensing voltage is preferably of low enough magnitude to provide negligible ohmic heating in the PCM 120. Accordingly, the electrical resistance state of the PCM can be determined in this manner without disturbing its written electrical resistance state. Data integrity is thereby maintained while reading the data.

Reference again to FIGS. 1A and 1B will show that, in accordance with aspects of the invention, the cell dielectric 140 comprises an opening that is partially filled by the dielectric pillar 130. In addition, the PCM 120 fills a narrow, ring-like volume between the dielectric pillar and the sidewalls of the cell dielectric. Advantageously, both of these unique design features act to force the switching current to pass through a confined volume in the PCM. As a result, this memory cell design provides high localized switching current density so that the magnitude of the switching current pulse can be reduced to a value that is compatible with modern integrated circuits.

When, for example, a switching current pulse is applied so that it travels from the bottom metal feature 160 to the top metal feature 170, the switching current passes through the lower electrode 110 and into the PCM 120. At this point, the current must circumnavigate the dielectric pillar 130. As a result, the switching current passes through the narrow, ring-like volume of the PCM between the dielectric pillar and the cell dielectric 140. Subsequently, after leaving the PCM, the current travels through the upper electrode 150 and into the top metal feature.

The confinement of the switching current to the narrow, ring-like volume surrounding part of the dielectric pillar 130 results in a high localized current density in this volume, and, in turn, high ohmic heating. For this reason, this volume forms the switchable volume of the PCM 120 in the memory cell 100. Outside of this switchable volume, the current density is insufficient to cause the transition between electrical resistance states. Accordingly, the switching current needed to effect an electrical resistance state change in the memory cell will largely be determined by the narrow volume of the PCM that forms part of the periphery of the void. The magnitude of this required switching current pulse will be substantially less than that which would be required to cause a state transition in the remainder of the PCM volume.

Moreover, in addition to restricting the switchable volume of the PCM 120 to that region between the dielectric pillar 130 and the cell dielectric 140, the memory cell 100 in FIGS. 1A and 1B also acts to thermally isolate this switchable volume. Reference to FIG. 1B shows that non-switching portions of the PCM are located above and below the switchable volume of the PCM, while dielectric material in the form of the dielectric pillar and cell dielectric surrounds the switchable volume laterally. Since PCMs such as GST and dielectric materials such as silicon dioxide and silicon nitride have relatively low thermal conductivities when compared to metals, this arrangement tends to trap heat within the switchable volume. Advantageously, this thermal isolation causes the heating efficiency of this switchable volume to be increased, again allowing the magnitude of switching current pulse to be reduced.

It should be noted that the dielectric pillar 130 in the embodiment shown in FIGS. 1A and 1B is substantially circular in a horizontal plane parallel to the plane defined by the interface of the dielectric pillar and the lower electrode 110 (i.e., when the dielectric pillar is viewed top down like in FIG. 1A). Such a shape may, for example, be advantageous with respect to the packing density of a plurality of such memory cells in an integrated circuit. Nevertheless, other shapes for the dielectric pillar (and the resultant opening in the cell dielectric) are contemplated and would still come within the scope of the invention. The dielectric pillar could for example be elliptical or rectangular (i.e., line like) in the horizontal plane defined above. These and other shapes may allow the switchable volume to be increased without concomitantly causing the current density to be substantially reduced at any point within the switchable volume during the application of a switching current pulse.

Figure 2A:
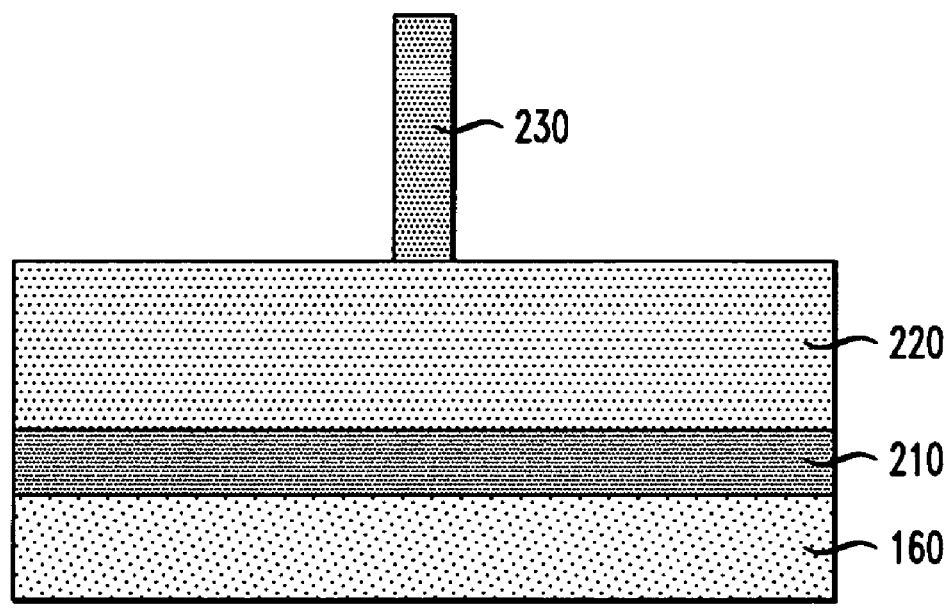
FIGS. 2A-2F show sectional views of the memory cell in FIGS. 1A and 1B during various stages of formation.
Figure 2B:
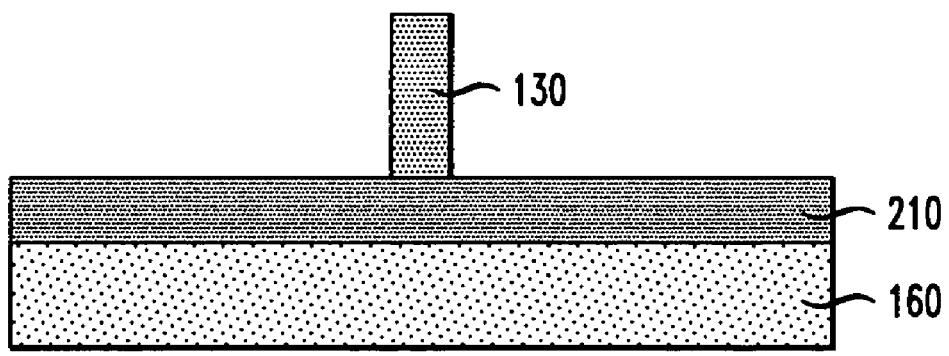

FIGS. 2A-2F show a processing sequence for forming the memory cell 100 shown in FIGS. 1A and 1B. Initially, a layer of lower electrode material 210 (e.g., titanium nitride or tantalum nitride) and a layer of dielectric pillar material 220 (e.g., silicon dioxide or silicon nitride) are sequentially deposited on top of the bottom metal feature 160. These layers are preferably deposited using sputter deposition or chemical vapor deposition (CVD). Next, conventional photolithography is utilized to form a photoresist masking feature 230 over the desired dielectric pillar, resulting in the film stack shown in FIG. 2A. With this photoresist masking feature in place, an anisotropic etching technique, preferably reactive ion etching (RIE), is used to remove portions of the layer of dielectric pillar material where the photoresist masking feature is not present. After stripping the photoresist masking feature, the dielectric pillar 130 is left on the surface of the layer of lower electrode material, as shown in FIG. 2B.

It should be noted that modern semiconductor processing techniques allow the dielectric pillar 130 to optionally be formed with a width substantially smaller than the photoresist masking feature 230 utilized to define the dielectric pillar. For example, the RIE processing step that patterns the dielectric pillar can be made to have a substantial "etch bias" that narrows the feature being etched in relation to the size of the photoresist masking feature. Additionally or alternatively, after RIE, the dielectric pillar can be exposed to a timed wet etch to reduce the size of the pillar. Hydrofluoric acid, for example, can be utilized to precisely etch features comprising silicon dioxide. Hot phosphoric acid may, alternatively, be utilized to etch features comprising silicon nitride.

Subsequently, a layer of PCM material 240 (e.g., GST) is deposited on the film stack shown in FIG. 2B. This deposition is preferably by collimated (i.e., directional) sputter deposition. Because of its directional nature, collimated sputter deposition tends to deposit material faster on horizontal surfaces than on vertical surfaces. In this way, the PCM is made thicker on the top of the layer of lower electrode material 210 and the top of the dielectric pillar 130 than on the sidewalls of the dielectric pillar. Next, a layer of cell dielectric material 250 (e.g., silicon dioxide) is deposited, preferably by conformal CVD, on top of the film stack. The resultant film stack is shown in FIG. 2C.

Figure 2C:
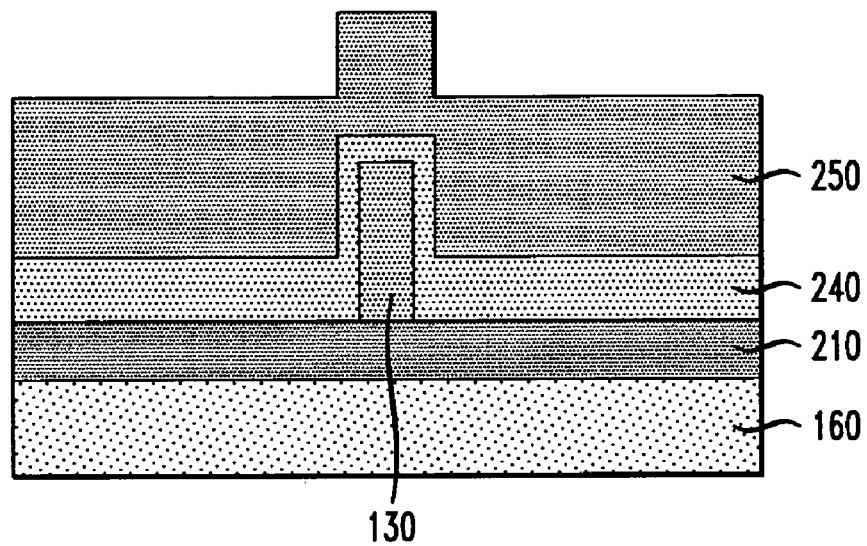
Figure 2D:
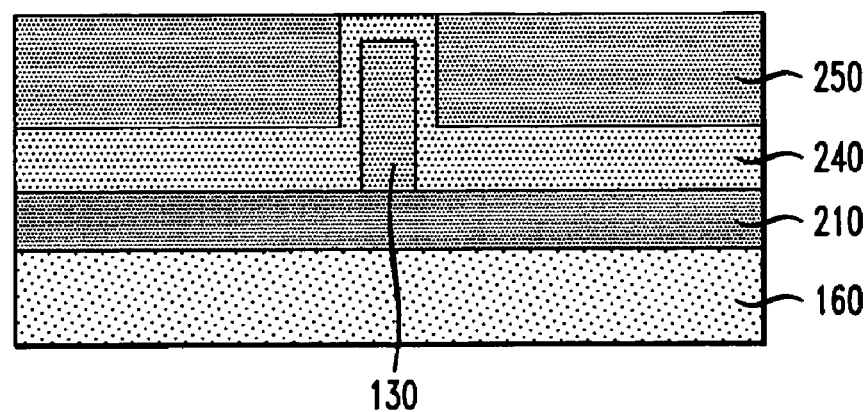

The film stack shown in FIG. 2C is then exposed to a chemical mechanical polishing (CMP) process. The CMP process is performed such that the layer of dielectric material 250 is removed in the region above the dielectric pillar 130. A characteristic opening is thereby created in the layer of cell dielectric material above the dielectric pillar. The resultant film stack is shown in FIG. 2D.

Figure 2E:
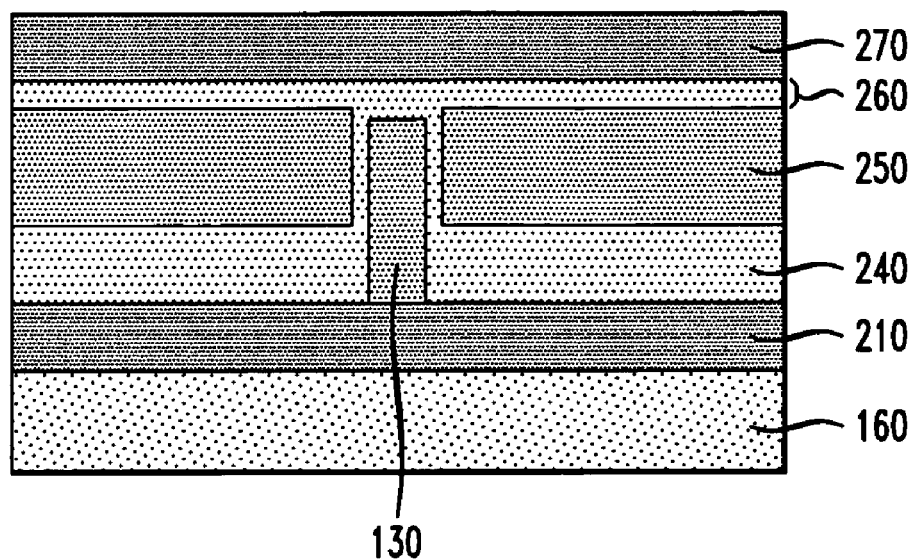
Figure 2F:
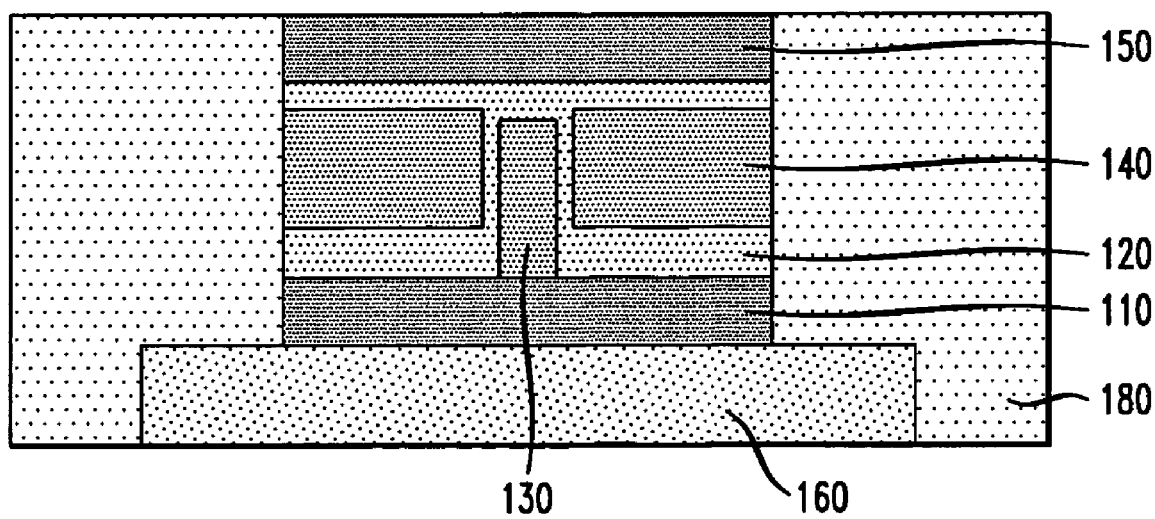

Next, an additional layer of PCM material 260 (e.g., GST) and a layer of upper electrode material 270 (e.g., titanium nitride or tantalum nitride) are deposited on the film stack, resulting in the film stack shown in FIG. 2E. The film stack is then exposed to additional conventional photolithography and RIE steps to form trenches between memory cells. A dielectric material (e.g., silicon dioxide) is deposited into these trenches to act as the interlevel dielectric 180. Any interlevel dielectric material deposited on top of the upper electrode 150 is removed by CMP, resulting in the film stack shown in FIG. 2F. Formation of the top metal feature 170 (e.g., copper) by deposition, photolithography and RIE or, alternatively, by a damascene process (e.g., patterning of silicon dioxide, copper deposition and CMP) results in the memory cell 100 and metal features 160, 170 shown in FIGS. 1A and 1B.

Figure 3A:
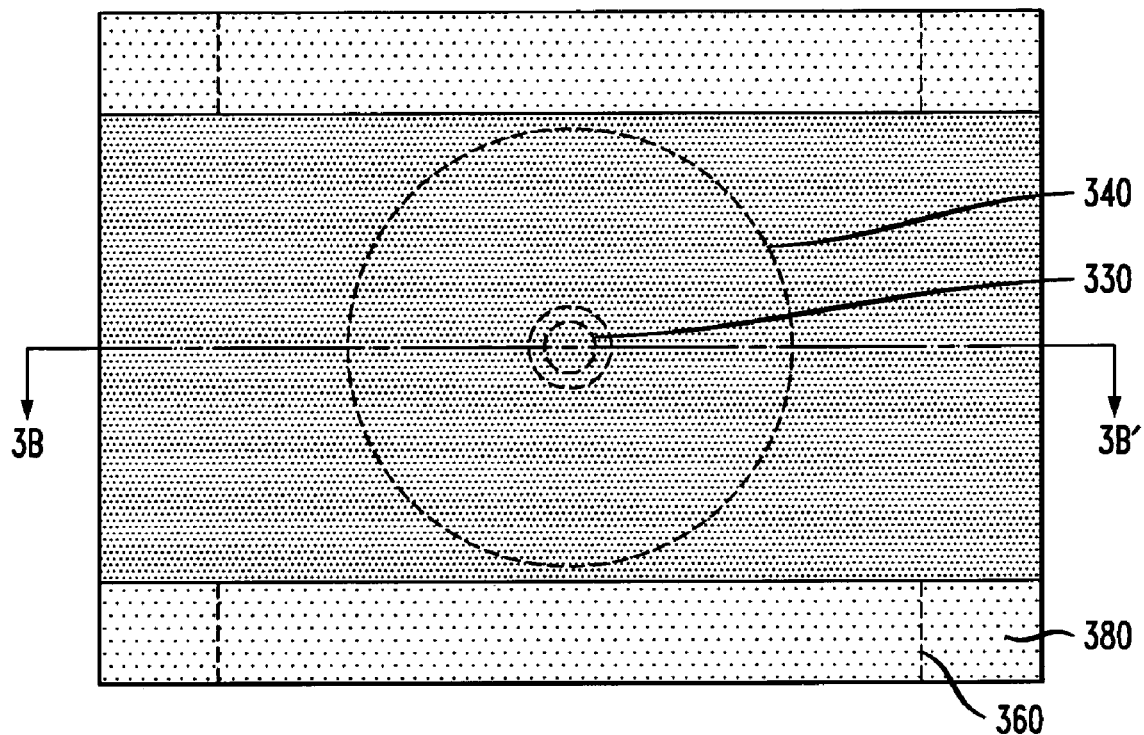
FIG. 3A shows a plan view of a PCM-based memory cell in accordance with a second illustrative embodiment of the invention.
Figure 3B:
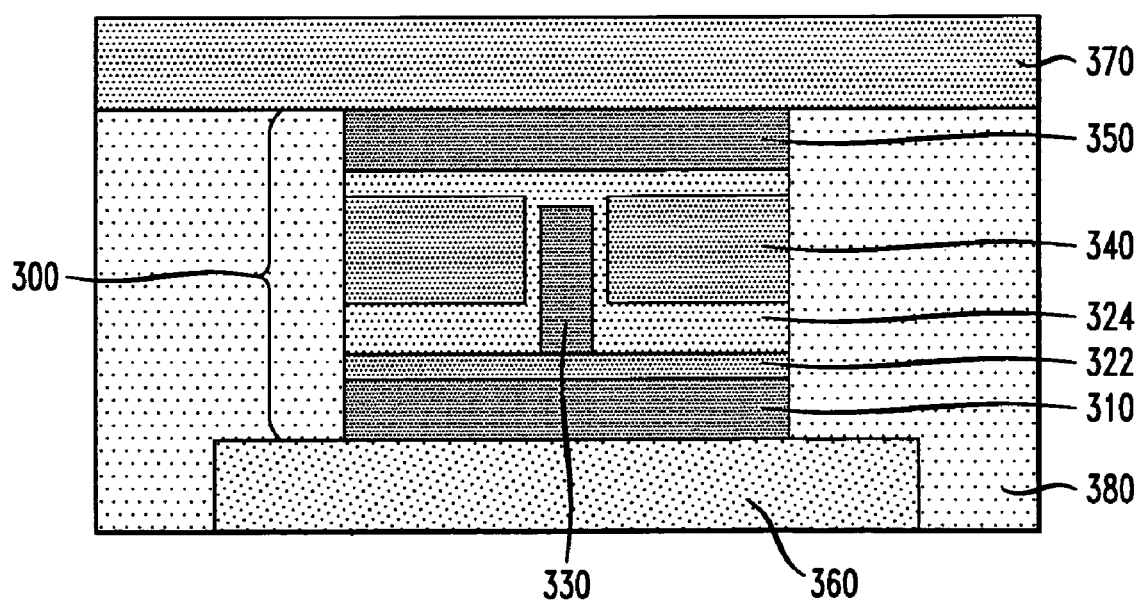
FIG. 3B shows a sectional view of the FIG. 3A memory cell cut in the plane indicated on FIG. 3A.

FIGS. 3A and 3B show a memory cell 300 in accordance with a second illustrative embodiment of the invention. FIG. 3A shows a plan view while FIG. 3B shows a sectional view cut in the plane along line 3B-3B' indicated on FIG. 3A. The memory cell comprises lower electrode 310, lower PCM 322, upper PCM 324, conductive pillar 330, cell dielectric 340 and upper electrode 350. The cylindrical memory cell, in turn, is formed between bottom metal feature 360 and a top metal feature 370. Interlevel dielectric 380 surrounds the memory cell and provides isolation between memory cells and metal features.

The memory cell 300 has several similarities to the memory cell 100 shown in FIGS. 1A and 1B. The bottom metal feature 360, for example, preferably comprises tungsten or copper while the top metal feature 370 preferably comprises copper. What is more, cell dielectric 340 preferably comprises silicon dioxide or silicon nitride while the lower and upper electrodes 310, 350 preferably comprise titanium nitride or tantalum nitride.

Nevertheless, in contrast to the memory cell 100, the pillar feature in the memory cell 300 (i.e., conductive pillar 330) comprises a conductive material such as titanium nitride or tantalum nitride rather than a dielectric material. Moreover, in the memory cell 300, the PCM filling the volume between the conductive pillar and the sidewalls of the cell dielectric 340 is formed with a particular electrical resistivity. More specifically, in accordance with an aspect of the invention, the upper PCM 324 is formed such that it has an electrical resistivity in its polycrystalline state higher than that of the conductive pillar.

The electrical resistivity of the upper PCM 324 can be adjusted using conventional semiconductor processing techniques. If the upper PCM comprises GST for example, its electrical resistivity can be tuned over several orders of magnitude by doping the material with dopants such as, but not limited to, nitrogen, oxygen, silicon, indium or silver. Generally, the greater the concentration of the selected dopant, the higher is the electrical resistivity of the resultant GST.

In a way similar to that used for the memory cell 100, storing data in the memory cell 300 comprises placing some portion of the total volume of the upper PCM 324 (again called the "switchable volume") into either a lower electrical resistance polycrystalline state or a higher electrical resistance amorphous state by applying a pulse of switching current to the memory cell through the bottom and top metal features 360, 370. When, for example, a switching current pulse is applied so that it travels from the bottom metal feature to the top metal feature, the switching current initially passes through the lower electrode 310 into the lower PCM 322. At this point, the electrical current must pass through the upper PCM and the conductive pillar 330 in order to reach the upper electrode. However, because, the upper PCM is configured to have an electrical resistivity higher than that of the conductive pillar, the majority of the current passes through the conductive pillar rather than through the upper PCM. After leaving the conductive pillar, the electrical current travels through the small portion of the upper PCM above the pillar and finally into the upper electrode and the top metal feature.

The passing of the electrical current through the conductive pillar 330 tends to channel most of the electrical current into that portion of the upper PCM 324 immediately above the conductive pillar. Moreover, the passing of electrical current through the conductive pillar causes the conductive pillar itself to heat up due to ohmic heating. This combination of high current density and proximity to the heated conductive pillar causes the volume of the upper PCM above the conductive pillar to be the most rapidly heated portion of the upper PCM. This volume of the upper PCM, thereby, becomes the switchable volume for the memory cell 300. Outside of this switchable volume, the heating is insufficient to cause the transition between electrical resistance states. Accordingly, the magnitude of the required switching current pulse will be substantially less than that which would be required to cause a state transition in the entire volume of the upper PCM.

It will be noted that the conductive pillar 330 is surrounded by the lower PCM 322 and the upper PCM 324. Advantageously, the relatively low thermal conductivities of these features cause the conductive pillar to be thermally isolated. This thermal isolation causes the heating efficiency of the conductive pillar to be increased and higher temperatures due to ohmic heating to be obtained in the conductive pillar for a given current pulse magnitude. Heating of the switchable volume is, in this way, further enhanced by a memory cell design having features in accordance with aspects of the invention. Again, this greater efficiency allows the magnitude of the switching current pulse to be reduced.

Figure 4A:
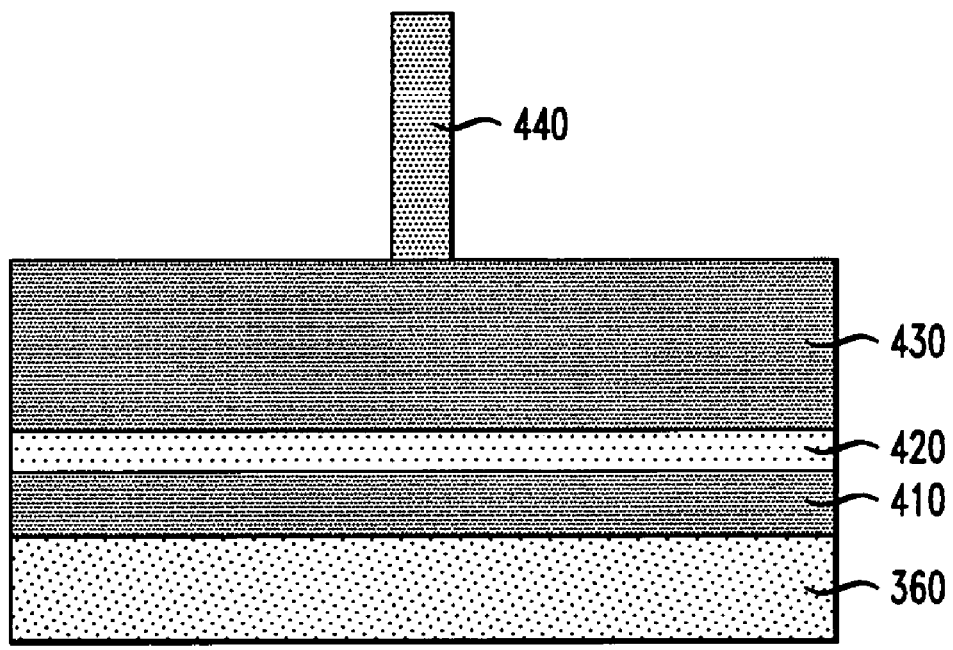
FIGS. 4A-4F show sectional views of the memory cell in FIGS. 3A and 3B during various stages of formation.
Figure 4B:
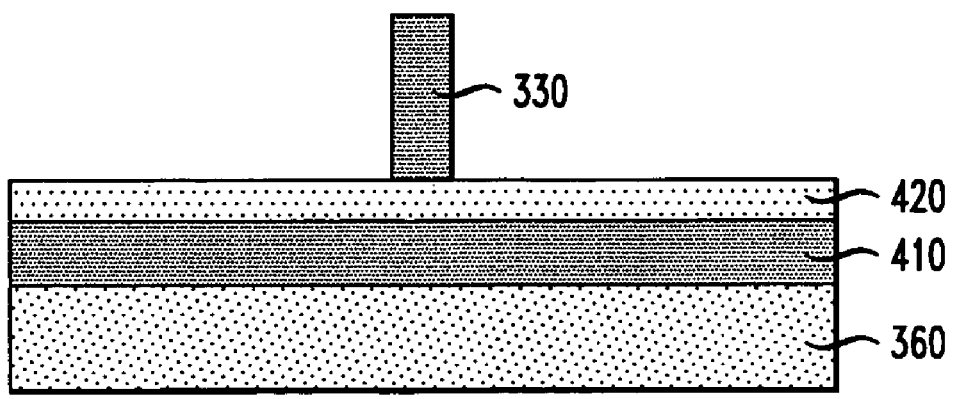

FIGS. 4A-4F show a processing sequence for forming the memory cell 300. Initially, a layer of lower electrode material 410 (e.g., titanium nitride or tantalum nitride), a layer of lower PCM material 420 (e.g., undoped GST) and a layer of conductive pillar material 430 (e.g., titanium nitride or tantalum nitride) are sequentially deposited on top of the bottom metal feature 360. The layer of lower electrode material and the layer of conductive pillar material are preferably deposited by sputter deposition or CVD while the layer of lower PCM material is preferably deposited by sputter deposition. Next, conventional photolithography is utilized to form a photoresist masking feature 440 over the desired conductive pillar, resulting in the film stack shown in FIG. 4A. With this photoresist masking feature in place, an anisotropic etching technique, preferably RIE, is used to remove portions of the layer of conductive pillar material where the photoresist masking feature is not present In this way, the conductive pillar 330 is formed, as shown in FIG. 4B after the photoresist masking feature is stripped. As before, modern semiconductor processing techniques allow the conductive pillar to optionally be formed with a width substantially smaller than the photoresist masking feature if this is desired.

Figure 4C:
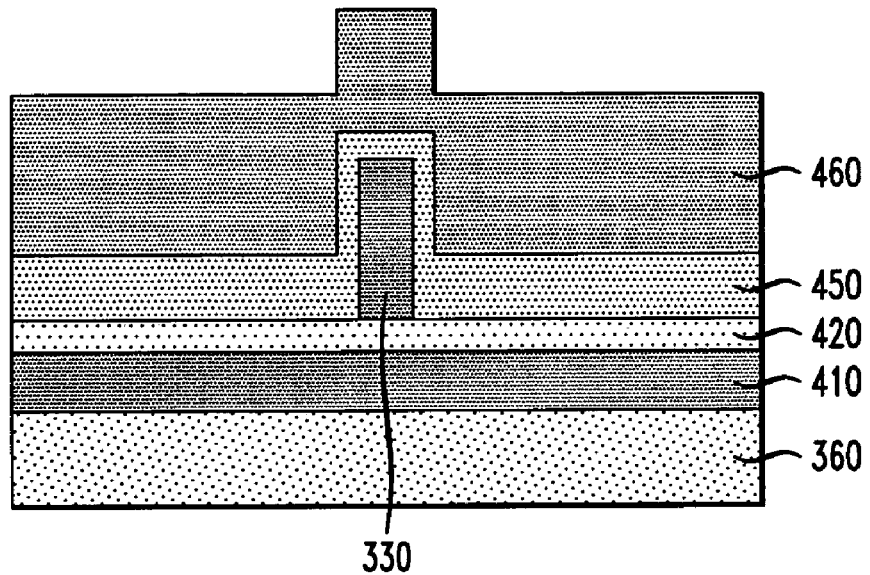

Subsequently, a layer of upper PCM material 450 (e.g., doped GST) is conformally deposited on the film stack. This deposition is preferably by collimated sputter deposition so that the upper PCM is made thicker on the top of the exposed horizontal surfaces than on the sidewalls of the conductive pillar 330. Next a layer of cell dielectric material 460 (e.g., silicon dioxide or silicon nitride) is deposited, preferably by CVD, on top of the film stack. The resultant film stack is shown in FIG. 4C.

Figure 4D:
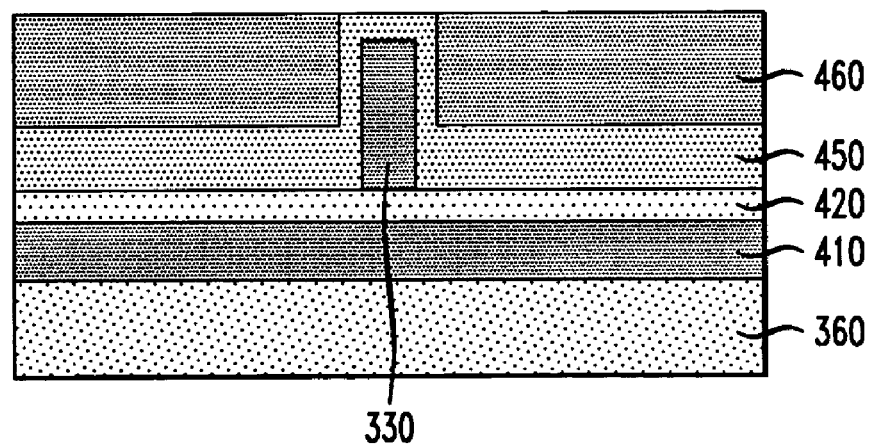

The film stack is then exposed to a CMP process. The CMP process is performed such that a portion of the layer of dielectric material 460 is removed in the region above the conductive pillar 330. The resultant film stack is shown in FIG. 4D.

Figure 4E:
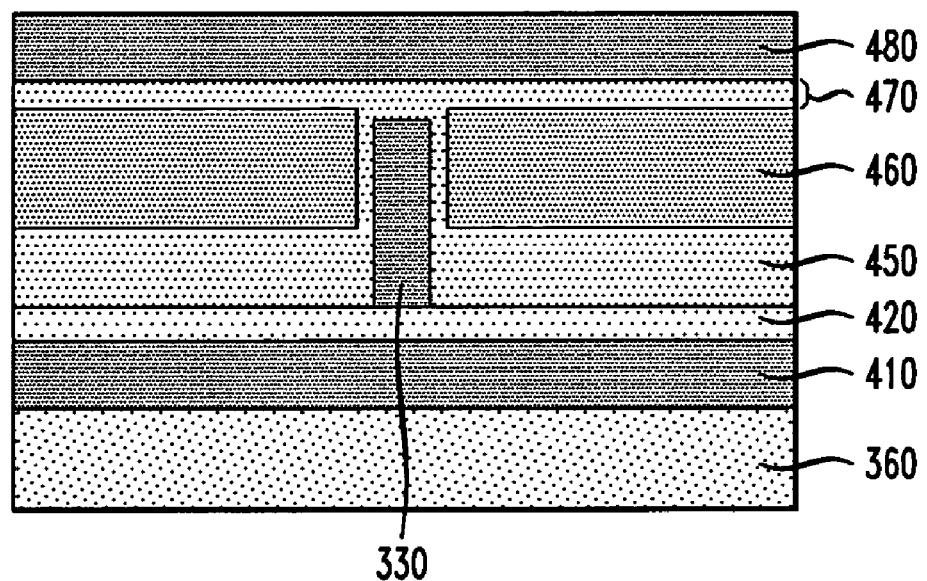
Figure 4F:
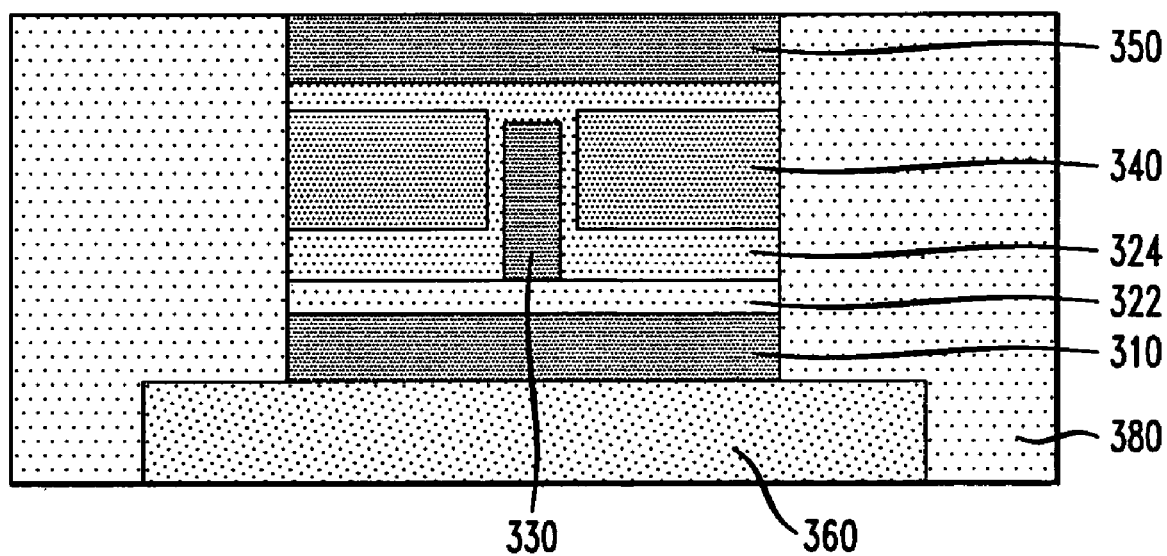

Next, an additional layer of upper PCM material 470 (e.g., doped GST) and a layer of upper electrode material 480 (e.g., titanium nitride or tantalum nitride) are deposited on the film stack. The resultant film stack is shown in FIG. 4E. The film stack is then exposed to additional conventional photolithography and RIE steps to form trenches between discrete memory cells. A dielectric material (e.g., silicon dioxide) is deposited into these trenches to act as the interlevel dielectric 380. Any interlevel dielectric material deposited on top of the upper electrode 350 is removed by CMP, resulting in the film stack shown in FIG. 4F. Formation of the top metal feature 470 (e.g., copper) by deposition, photolithography and RIE or, alternatively, by a damascene process (e.g., patterning of silicon dioxide, copper deposition and CMP) results in the memory cell 300 and metal features 360, 370 shown in FIGS. 3A and 3B.

The processes described herein may be implemented to form an integrated circuit. In forming integrated circuits a plurality of identical die is typically fabricated in a repeated pattern on a surface of a semiconductor wafer. Each die includes a memory cell formed by the methods falling within the scope of the invention set forth herein, and may also include other structures or circuits. The individual die are cut or diced from the semiconductor wafer and then packaged as integrated circuits. One skilled in the art will know how to dice wafers and package die to produce integrated circuits. Integrated circuits so manufactured are considered part of this invention.

Although illustrative embodiments of the present invention have been described herein with reference to the accompanying figures, it is to be understood that the invention is not limited to those precise embodiments, and that various other changes and modifications can be made to these embodiments by one skilled in the art without departing from the scope of the appended claims.

What is claimed is:

1. A memory cell comprising:
    a first and a second metal electrode, the electrodes operative to allow the application of the switching signal to the memory cell;
    a first feature comprising an electrical conductor, the first feature being in direct physical contact with the first metal electrode;
    a second feature, the second feature comprising a dielectric material and defining an opening at least partially overlying the first feature such that the second feature is not in direct physical contact with the first feature;
    a substantially columnar third feature, the third feature formed on the first feature such that the third feature is in direct physical contact with the first feature, the third feature partially filling the opening in the second feature, the third feature comprising an electrically conductive material, the third feature being substantially circular or substantially elliptical in a plane parallel to a plane defined by the interface of the third feature and the first feature; and
    phase change material, the phase change material at least filling a volume between the second feature and the third feature;
    wherein the first feature physically separates the second feature and the first electrode such that there is no direct physical contact between the second feature and the first electrode;
    wherein the first feature physically separates the third feature and the first electrode such that there is no direct physical contact between the third feature and the first electrode;
    wherein the first feature physically separates the phase change material and the first electrode such that there is no direct physical contact between the phase change material and the first electrode;
    wherein the phase change material is in direct physical contact with the first feature;
    wherein the phase change material is in direct physical contact with the second feature;
    wherein the phase change material is in direct physical contact with the third feature;
    wherein the phase change material is in direct physical contact with the second electrode;
    wherein the phase change material physically separates the first feature and the second feature such that there is no direct physical contact between the first feature and the second feature;
    wherein the phase change material physically separates the second feature and the third feature such that there is no direct physical contact between the second feature and the third feature;
    wherein the phase change material physically separates the first feature and the second electrode such that there is no direct physical contact between the first feature and the second electrode; and
    wherein the phase change material physically separates the second feature and the second electrode such that there is no direct physical contact between the second feature and the second electrode; and
    wherein the phase change material physically separates the third feature and the second electrode such that there is no direct physical contact between the third feature and the second electrode;
    wherein at least a portion of the phase change material is operative to switch between lower and higher electrical resistance states in response to an application of a switching signal to the memory cell, the portion of the phase change material operative to switch between lower and higher electrical resistance states being substantially located near a surface of the third feature opposite to that formed on the first feature and being substantially located within the volume between the second feature and the third feature; and
    wherein the first feature comprises a phase change material having a composition different from that of the phase change material filling the volume between the second feature and the third feature, the phase change material filling the volume between the second feature and the third feature having a higher electrical resistivity than the electrical conductor forming the third feature.

* * * * *